June 20, 1972 HIDEO TATENO ET AL 3,671,339
METHOD OF FABRICATING SEMICONDUCTOR DEVICES HAVING ALLOYED JUNCTIONS
Filed Sept. 25, 1969 2 Sheets-Sheet 1
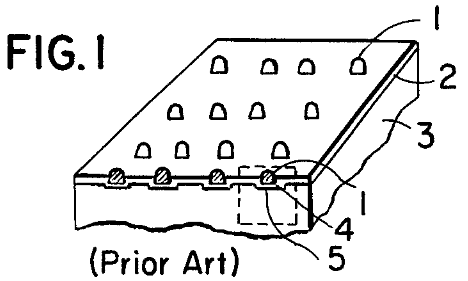
(Prior Art)
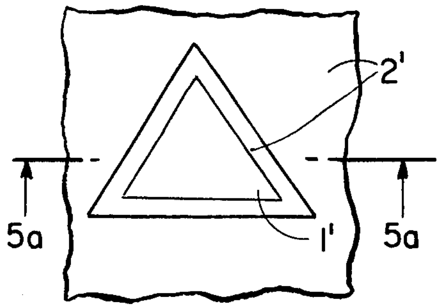
FIG.5
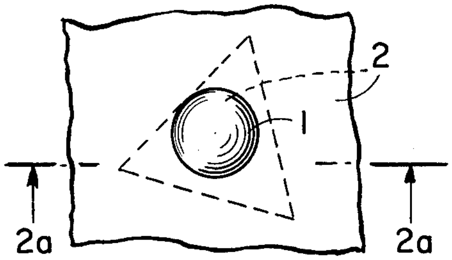
(Prior Art)
FIG. 2
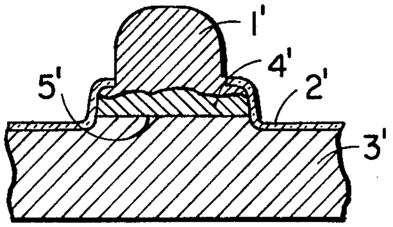
FIG.5a
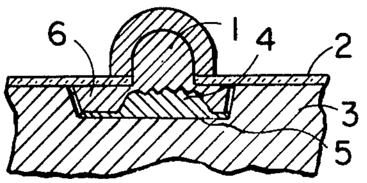
(Prior Art)
FIG.2a
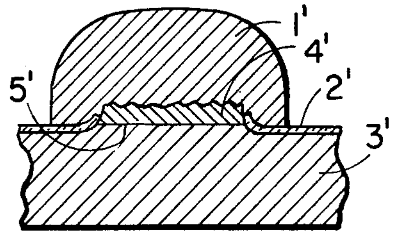
FIG.6
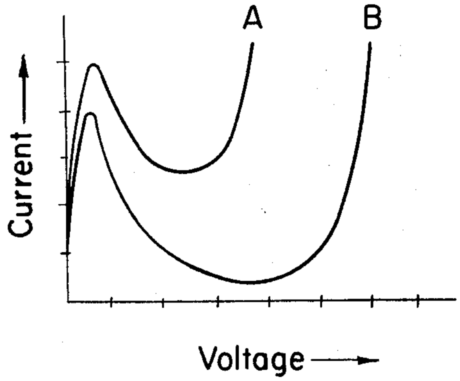
FIG.3
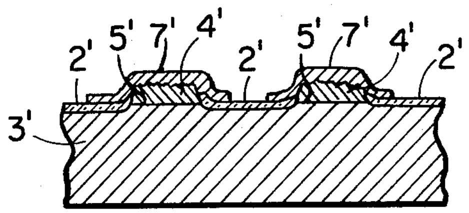
FIG.7
INVENTORS
Hideo Tateno
Kuniharu Nemoto
by Sandoe, Hopgood & Calimafde
ATTORNEYS

*INVENTORS*
Hideo Tateno
Kuniharu Nemoto
by Sandoe, Hopgood & Calimafde
ATTORNEYS United States Patent Office 3,671,339
Patented June 20, 1972

3,671,339
METHOD OF FABRICATING SEMICONDUCTOR DEVICES HAVING ALLOYED JUNCTIONS

Hideo Tateno and Kuniharu Nemoto, Tokyo, Japan, assignors to Nippon Electric Company, Limited, Tokyo, Japan Filed Sept. 25, 1969, Ser. No. 861,080
Claims priority, application Japan, Sept. 30, 1968, 43/71,619
Int. Cl. H01l 7/46
U.S. Cl. 148—179 2 Claims

ABSTRACT OF THE DISCLOSURE

A method of fabricating alloyed junction semiconductor devices is disclosed in which the junction is prepared in the form of a mesa having a predetermined position and configuration. The alloy junction is formed within that protrusion, thereby to control the spread of the alloying material.

This invention relates to a method for securing uniform alloy junction areas, an important determinant for the characteristics of resulting alloy junction semiconductor devices.

BACKGROUND OF THE INVENTION

To attain stabilized operating characteristics, planar techniques, whereby external electrodes are kept out of direct contact with P–N junctions, have already been adopted for the fabrication of various semiconductor devices. In corporation of the planar concept in the fabrication of Esaki diodes has also been a subject of study by a number of workers in the field. A typical procedure is to provide an insulating film over a semiconductor substrate and to make holes of a desired size through the insulating film as by a photo-etching process. A metal (hereinafter referred to as "alloying material") that contains an impurity having a conductivity type opposite to that of the semiconductor substrate is then deposited over the semiconductor substrate as by vacuum evaporation, and a suitable amount of the alloying material is then left in the holes of the insulating film again by a photo-etching process. Subsequent alloying of the metal thus produces tunnel junctions. The technical details of this method are reported in publications such as "Solid State Electronics," 1967, vol. 10, pp. 461–472, and the "IBM Journal of Research and Development," November 1964, pp. 527–531.

When alloying is performed in the manner described above, the alloying material extends below the insulating film. The pattern of the extension varies with the crystal plane of the semiconductor substrate to be encountered. For example, on the (111) plane of the single crystal, the alloy extends to the shape of an equilateral triangle beneath the film. In such a case, the growth of the re-crystallized layer on alloying through quick heating and quick cooling as in the preparation of an Esaki diode, tends to become incomplete at the tips of the subsurface extension pattern, with a consequent increase of the valley current (hereinafter referred to a "Iv") and a harmful deterioration of the characteristics of the Esaki diode. Among other important disadvantages involved in the triangular extension of the alloyed junctions is that the areas of such junctions cannot be kept uniform, thus making it impossible to obtain the desired predetermined values of the junction capacity and peak current (hereinafter referred to as "Ip") of the individual P–N junctions.

The present invention aims at providing a method for fabricating alloyed junction semiconductor devices such as Esaki diodes having improved operating characteristics by controlling the extension of the alloying material under the insulating film so as to maintain uniform alloy junction areas and to avoid the growth of an incomplete re-crystallized layer.

SUMMARY OF THE INVENTION

The method of the invention is characterized by predetermining the position, shape and size of the junction to be formed by alloying and then preparing such junction in the form of a protrusion or "mesa," thereby to control the spread of the alloying material by dint of the size and shape of the mesa.

Crystallographic studies have disclosed that alloys, in the course of alloying, take many different shapes depending on the crystalline structures involved.

It is also known that the rate at which a crystal is corroded or etched away by a chemical etching solution or a metallic alloy depends largely on the orientation of the crystal axis. For example, in a single crystal of germanium, the corrosion rate is high in the direction of the axis (211) but is low in the direction of the axis (111). It will be seen that, because of this property of the crystal, the shape that spreads beneath the insulating film is in the form of a regular triangular pyramid over the plane (111) of germanium substrate or in the form of a regular quadrangular pyramid over the plane (100). This means that the pattern of extension of the alloy should be defined by the straight lines where the plane (111) crosses the surface of the substrate crystal. For example, as will be seen by the stereographic projection often used in crystallography, it assumes a hexagonal shape in the plane (110) of crystal. The fact that such polygonal shapes result is well in agreement with the disclosure in a paper published in the "Journal of the Electrochemical Society," March 1961, 108, No. 3, p. 241. For this reason, an attempt to control the alloy area by the shape of the hole made in the insulating film proves to be futile, since the crystal under the insulating film is so rapidly corroded in the direction of the axis (211) and hence there is no means to avoid the extension of the alloying shape beyond the desired hole contour. In this extended portion the amount of germanium is rather insufficient for the growth of the re-crystallized layer on cooling, and thus it becomes difficult to obtain a perfect recrystallized layer. This naturally leads to a reduction in reliability and is also not desirable for the initial tunnel characteristic.

By applying the method of the present invention, in which each portion to be alloyed is protruded to form a mesa of the contour conforming to the pattern of the spread of the alloy so that the portion to be corroded by the alloying metal is limited, it is possible to avoid further progress of corrosion beyond the mesa. Here, the height of the mesa must be greater than the depth of the alloyed junction to be formed. By suitably choosing the height, size and shape of the inividual mesa in this way, a completely controlled junction area can be obtained. And by minimizing the size of the mesa and therefore the scope of the extension, it becomes possible to form a completely re-crystallized layer. Consequently, the static capacity of the resulting P-N junction and Ip is made uniform and the value of Iv is reduced, with a resulting increase in the $Ip:Iv$ ratio. Since the improvement and uniformalization of the characteristics are realized in the manner described, the semiconductor product is admirably adapted for quantity production.

The invention may best be understood by reference to the following description taken in conjunction with the accompanying drawings, the description of which follows:

FIG. 1 is a perspective view of a conventional semiconductor substrate having a multiplicity of planar type alloyed junctions;

FIG. 2 is an enlarged top view of the portion of the semiconductor structure of FIG. 1 enclosed by broken lines therein;

FIG. 2(*a*) is a sectional view taken along the line 2a—2a of FIG. 2;

FIG. 3 is a graph showing the voltage-current characteristics of an Esaki diode;

Figure 4:
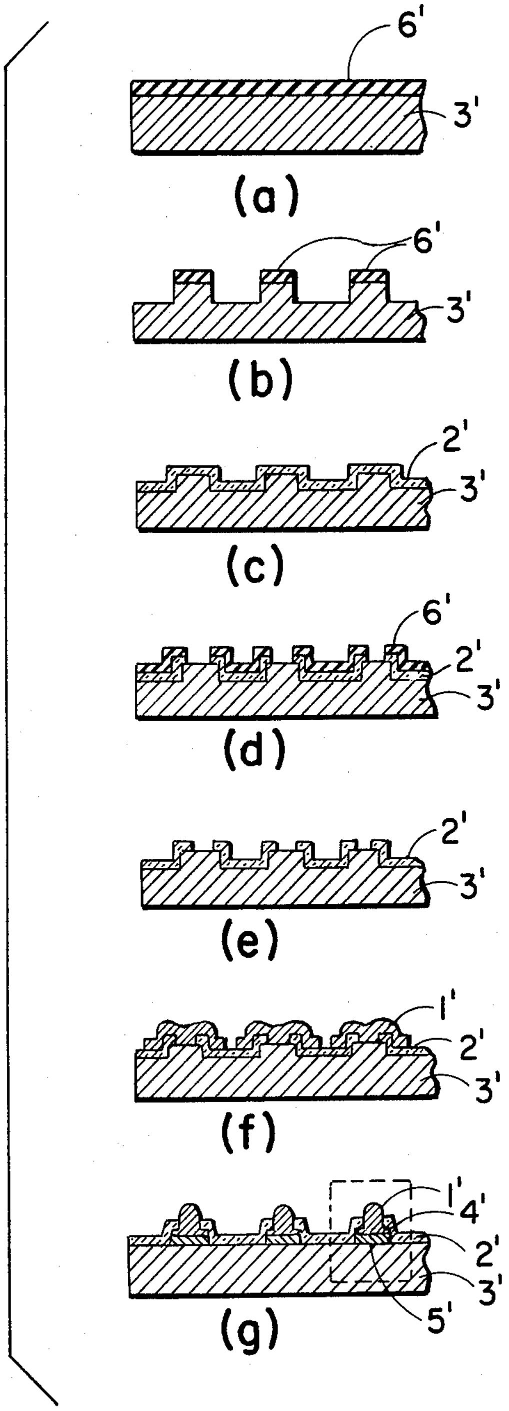

FIGS. 4(*a*) to (*g*) are sectional views explanatory of a sequence of steps for the fabrication of an embodiment of the present invention;

FIG. 5 is an enlarged top view of the portion of the semiconductor structure of FIG. 4(*g*) enclosed by broken lines;

FIG. 5(*a*) is a sectional view taken along the line 5a—5a of FIG. 5; and

FIGS. 6 and 7 are sectional views of other embodiments of the present invention.

DETAILED DESCRIPTION OF THE INVENTION

A conventional semiconductor device construction and the method of fabricating the same are briefly described with reference to FIGS. 1, 2 and 2(*a*). An insulating film 2 is formed as by vapor deposition in a vacuum over a semiconductor substrate 3 of a certain conductivity type (N- or P-type). The surface of semiconductor substrate 3 is partly exposed by opening windows of a suitable size through the insulating film 2 by photoetching in the manner explained later or by masking with a highly chemically-resistant wax and subsequent chemical etching. Next, by vacuum evaporation, an alloying material 1 containing an impurity of a conductivity type opposite to that of the semiconductor substrate 3 is deposited over the entire surface. Again by photo- and chemical-etching the alloying material 1 is etched away, leaving a suitable amount in each window of the insulating film 2. Alloying is then effected at a temperature of between 350° and 650° C. to form a re-crystallized layer 4 and a tunnel junction 5 as shown in FIGS. 1, 2 and 2(*a*). FIG. 2 shows an enlarged top view of one trunnel junction portion enclosed by the broken lines in FIG. 1, and FIG. 2(*a*) shows a sectional view of the enlarged top view. As can best be seen in FIGS. 2 and 2(*a*), the characteristics of the tunnel junction 5 are deleteriously affected by the presence of the incompletely re-crystallized layer 6 due to the portion of the alloying material 1 spreading under the insulating film 2. A typical voltage-current characteristic of an Esaki diode conventionally fabricated in the manner explained above is represented by the curve A in FIG. 3.

Next, an embodiment of the present invention as applied to the fabrication of an Esaki diode is explained with reference to FIG. 4.

As shown in FIG. 4(*a*), a photo resist 6′ is applied on the upper surface of a germanium substrate 3′ of N-type conductivity having a crystal plane (111). After exposure and development, portions of the photo resist 6′ having the shape of an equilateral triangle are left at intervals of 0.4 mm. over the germanium substrate 3′. Each side of these triangles measures 50$\mu$ and one side of each triangle is matched to the straight line where the plane (111) intersects the surface of the germanium substrate 3′. Taking advantage of the high chemical resistance of the photo resist 6′, the germanium substrate 3′ is chemically etched with a mixed solution of fluoric acid and nitric acid. As shown in FIG. 4(*b*), this results in the formation of mesa portions in the form of regular triangular prisms having sides measuring about 40$\mu$ each and which are 5$\mu$ high. Over the entire surface of the germanium substrate 3′ freed of the photo resist 6′, a layer of silicon dioxide 2′ is allowed to grow such as by a vapor growth process to a thickness of about 1$\mu$ as shown in FIG. 4(*c*). Again employing a photo-etching technique which consists of applying a photo resist 6″ to the silicon dioxide layer 2′, exposing and developing the same, and further chemically etching silicon dioxide layer 2′, a provisional structure as shown in FIG. 4(*d*) is obtained. The complete removal of the photo resist 6″ reduces the structure to one as shown in FIG. 4(*e*). Thus, the top surface of each mesa portion is partially exposed in the form of concentric equilateral triangles, each side of which measures 30$\mu$. Thereafter, an indium-gallium alloy 1′ is deposited, such as by vacuum evaporation, on the surface to a thickness of about 2$\mu$. The photo-etching is again resorted to in combination with chemical etching, and the indium-gallium alloy 1′ is etched away at all areas where it overlies the silicon dioxide layer 2′, but leaving lumps of a suitable amount each measuring about 100$\mu$ in diameter on the exposed surface portions of germanium substrate 3′. The photo resist is then removed. The structure in this stage is as shown in FIG. 4(*f*). Subsequently, alloying is carried out by quick heating at 550° C. for 10 seconds and by quick cooling so as to form a tunnel junction in a nitrogen atmosphere. Thereupon, as shown in FIG. 4(*g*), the indium-gallium alloy 1′ is caused to form a ball-like face by its own surface tension, and a P-type re-crystallized layer 4′ and a tunnel junction 5′ are formed where the indium-gallium alloy 1′ and the germanium substrate 3′ have melted together. FIG. 5 shows an enlarged top view of the portion of FIG. 4(*g*) enclosed by the broken lines and FIG. 5(*a*) is a sectional view taken along the line 5a—5a of the top view of FIG. 5. It will be seen from FIGS. 5 and 5(*a*) that the indium-gallium alloy 1′ spreads in the mesa portion only and that the re-crystallized layer 4′ and the tunnel junction 5′ are shaped to sizes limited by the contour of the mesa portion. A typical voltage-current characteristic of an Esaki diode fabricated in this way is represented by the curve B in FIG. 3. The average $Ip:Iv$ ratio of 2 to 3 of the conventional diode of FIGS. 1 and 2 thus can be remarkably improved to an average of 8 by the method of the present invention. Moreover, the deviation of Ip values can be controlled within $\pm 10$ percent, and that of the junction capacities to within $\pm 15$ percent. Since control is now possible in this manner, there is no longer a possibility of the characteristic values of the Esaki diode appreciably deviating from their initial design values.

A few modifications of the above embodiment are now described with reference to FIGS. 6 and 7. While the mesa portions in the embodiment described above are provided in the form of regular triangular prisms, they need not always be so shaped and it will be noted that, especially where a germanium crystal or the like of the plane (100) is employed, it is rather advantageous to provide them in the form of square prisms from the viewpoint of the crystal structure. In this manner the mesa portions are allowed to take any shape desired so that they correspond to the pattern of the extension of the alloy to be formed.

Thus, as illustrated in FIG. 6, the amount of indium-gallium alloy 1′ may be increased sufficiently to cover the entire surface of the individual mesa of a germanium substrate 3′, thereby to facilitate the connection of lead-out electrodes therefrom. In this case it is possible to cover the individual mesa of the germanium substrate 3′ with silicon dioxide 2′ only up to the base of the mesa, as shown in FIG. 6, instead of covering the entire side surface of the mesa.

In another modification shown in FIG. 7, a pair of mesas are formed on a germanium substrate 3′ and tunnel junctions 5′ of substantially the same characteristic are made by the procedure as described above. Next, a low-melting-point metal such as indium-gallium 1′ is etched away to expose re-crystallized layers 4′. A high-melting-point metal 7′ is then deposited over the entire surface of a silicon dioxide film 2′ by vacuum evaporation or other suitable treatment. Except for the regions which are to serve as electrodes in the vicinity of the recrystallized layers 4', the high-melting-point metal 7' is etched away by photo-etching and chemical etching techniques. In this manner a perfect chip-type Esaki diode having symmetrical characteristics in both forward and reverse directions is obtained.

In still another possible modification to the present invention, where some dispersion is permissible in controlling the alloying areas, the columnar mesa portions are not formed but the present invention is partly applied to the process for fabricating a planar structure, wherein in making holes through the insulating film, the contour of the holes is aligned to the pattern and direction of the extension of the alloy, so that the amount of alloy spread under the insulating film may be reduced and imperfections of the re-crystallized layer may be prevented.

While the present invention has been described in connection with germanium semiconductors, it is obvious that the invention is equally applicable to other semiconductor materials such as silicon and intermetallic compounds.

Thus, while only several embodiments of the present invention have been herein specifically disclosed, it will be apparent that variations may be made therein without departure from the spirit and scope of the invention.

We claim:

1. A method for fabricating a tunnel diode which comprises the steps of forming at least one protrusion on a semiconductor crystal, said protrusion being of a triangular shape and corresponding in configuration to the (111) plane of said semiconductor crystal, and thereafter forming a tunnel-effect junction by an alloying method within said protrusion, the edge of said tunnel-effect junction being limited by the side surface of said protrusion so that the tunnel-effect is not affected at the marginal portions of said junction.

2. The method of claim 1, which further comprises the steps of forming an insulating layer over said protrusion, thereafter removing a predetermined area of said insulating layer, thereby exposing an area of said protrusion, and thereafter depositing an alloy material on the exposed area of said protrusion.

References Cited

UNITED STATES PATENTS 3,294,600 12/1966 Yokota ............ 148—177

RICHARD O. DEAN, Primary Examiner

U.S. Cl. X.R.

148—33.1, 33.3, 180, 185; 317—235 AK, 235 AS